United States Patent
Von Freyhold et al.

(10) Patent No.: US 11,557,881 B2
(45) Date of Patent: Jan. 17, 2023

(54) DIODE LASER

(71) Applicant: JENOPTIK OPTICAL SYSTEMS GMBH, Jena (DE)

(72) Inventors: Nikolas Von Freyhold, Jena (DE); Juergen Wolf, Schloeben (DE); Petra Hennig, Moersdorf (DE)

(73) Assignee: Jenoptik Optical Systems GmbH, Jena (DE)

( * ) Notice: Subject to any disclaimer, the term of this patent is extended or adjusted under 35 U.S.C. 154(b) by 193 days.

(21) Appl. No.: 16/761,460

(22) PCT Filed: Nov. 2, 2018

(86) PCT No.: PCT/EP2018/080034
§ 371 (c)(1),
(2) Date: May 4, 2020

(87) PCT Pub. No.: WO2019/086619
PCT Pub. Date: May 9, 2019

(65) Prior Publication Data
US 2020/0395738 A1 Dec. 17, 2020

(30) Foreign Application Priority Data
Nov. 3, 2017 (DE) .................. 10 2017 219 581.9

(51) Int. Cl.
*H01S 5/40* (2006.01)
*H01S 5/024* (2006.01)
*H01S 5/02365* (2021.01)

(52) U.S. Cl.
CPC ........ *H01S 5/4018* (2013.01); *H01S 5/02365* (2021.01); *H01S 5/02469* (2013.01); *H01S 5/4043* (2013.01)

(58) Field of Classification Search
CPC .................. H01S 5/02365; H01S 5/02355
See application file for complete search history.

(56) References Cited

U.S. PATENT DOCUMENTS

| | | |
|---|---|---|
| 4,716,568 A | 12/1987 | Scifres et al. |
| 5,105,429 A | 4/1992 | Mundinger et al. |
| 6,891,724 B2 | 5/2005 | Lorenzo et al. |
| 7,784,531 B1 | 8/2010 | Li et al. |

(Continued)

FOREIGN PATENT DOCUMENTS

| CN | 206422383 U | 8/2017 |
|---|---|---|
| DE | 10 2017 001 743 A1 | 4/2008 |

(Continued)

OTHER PUBLICATIONS

Lu et al., "Cold welding of ultrathin gold nanowires," Nature Nanotechnology, vol. 5, No. 3, pp. 218-224 (2010).
(Continued)

*Primary Examiner* — Tuan N Nguyen
(74) *Attorney, Agent, or Firm* — Muncy, Geissler, Olds & Lowe, P.C.

(57) ABSTRACT

The invention relates to a laser assembly (1) comprising a diode laser bar (2), a heat sink (4) and at least one cover (7). The laser bar is located between the heat sink and the cover. The heat sink and/or the cover is/are coated with nanowires (16) or nanotubes via which the contact between the laser bar and the heat sink and/or the cover is established.

16 Claims, 5 Drawing Sheets

(56) References Cited

U.S. PATENT DOCUMENTS

| | | | |
|---|---|---|---|
| 8,093,715 B2 | 1/2012 | Xu et al. | |
| 8,486,766 B2 | 7/2013 | Schroeder et al. | |
| 8,649,405 B2 | 2/2014 | Schröder et al. | |
| 2006/0029117 A1* | 2/2006 | Valiente | H01S 5/02365 372/87 |
| 2009/0068387 A1* | 3/2009 | Panzer | B32B 37/02 156/247 |
| 2011/0207328 A1* | 8/2011 | Speakman | H01L 51/0011 438/694 |
| 2012/0299175 A1 | 11/2012 | Tran | |

FOREIGN PATENT DOCUMENTS

| | | |
|---|---|---|
| DE | 10 2015 013 511 B3 | 3/2017 |
| EP | 1 513 271 B1 | 8/2015 |
| WO | WO 2007/137097 A2 | 11/2007 |
| WO | WO 2008/036571 A2 | 3/2008 |
| WO | WO 2008/121970 A1 | 10/2008 |
| WO | WO 2009/0143835 A2 | 12/2009 |
| WO | WO 2009/146683 | 12/2009 |
| WO | WO 2011/029846 A1 | 3/2011 |
| WO | WO 2018/044706 A1 | 3/2018 |

OTHER PUBLICATIONS

Nanowired, found at http://www.nanowired.de, p. 1, with English translation (2017).

* cited by examiner ical expansion of the components, mechanical stresses can affect the laser bars. Particularly during pulsed operation of the laser, alternating mechanical loads can occur, which can limit the lifetime of the diode laser.
DIODE LASER

TECHNICAL FIELD

The invention relates to a laser radiation source having a high power density. Such laser radiation sources can be produced on the basis of diode laser elements, in particular laser bars.

PRIOR ART

For some time, methods for producing a diode laser have been known in which a laser bar is soldered onto a heat sink on the p-side and contacting is effected by way of bond wires on the n-side, e.g. from U.S. Pat. Nos. 5,105,429A and 4,716,568A. The limited current-carrying capacity of the bond wires is disadvantageous. A higher current-carrying capacity of the n-side current connection can be achieved by the use of a solid cover, which can be embodied as a second heat-conducting body. WO2009143835 and WO2009146683 disclose soldering the laser bar on between two heat-conducting bodies. The soldering process can result in stresses in the laser bar, which can adversely affect the electro-optical properties. WO2011029846 discloses a method for producing a diode laser without a soldering process being involved, which makes use of a first metallic layer between the first contact surface of the laser bar and the first heat-conducting body and a second metallic layer between the second contact surface of the laser bar and the second heat-conducting body. These layers, which can consist of indium, for example, bring about a cohesive engagement during clamping. What is disadvantageous is that very stringent requirements have to be made in respect of the flatness of the laser bar and in respect of the flatness of the connection surfaces of the two heat-conducting bodies and in respect of maintaining the parallelism of the surfaces during mounting. Deviations in the μm range can already result in large-area cavities at which no cohesive engagement is present. In particular, a deficiently formed cohesive engagement at the p-side contact surface of the laser bar can lead to overheating and even erosion of the laser bar. Migration of material of the indium layers can additionally occur. Failure of the laser can occur as a result.

DE102015013511B3 discloses a laser radiation source having a high power density in which laser bars with intermediate heat-conducting bodies are soldered onto a ceramic substrate. What is disadvantageous is that, owing to different coefficients of thermal expansion of the components, mechanical stresses can affect the laser bars. Particularly during pulsed operation of the laser, alternating mechanical loads can occur, which can limit the lifetime of the diode laser.

EP 1518271 discloses a housing comprising nanotubes for cooling semiconductor chips. U.S. Pat. No. 6,891,724 B2 discloses producing an array of carbon nanotubes on a semiconductor chip in order to improve the heat transfer at the thermal interface between the chip and the heat sink. U.S. Pat. No. 7,784,531 B1 discloses filling the interspaces between carbon nanotubes with a filling material. WO 2008036571 discloses filling the interspaces between carbon nanotubes with a thermally conductive filling material. U.S. Pat. No. 8,093,715 B2 discloses a method for producing carbon nanotubes as a thermal interface. WO 2007137097 and WO 2008121970 disclose methods for producing carbon nanotubes on a copper substrate. US 20120299175 A1 discloses a method for producing carbon nanotubes on a wafer.

Problem Addressed by the Invention

The problem addressed by the invention is that of providing a high-power diode laser constructed in a simple manner.

Solution to the Problem

The problem is solved by means of a diode laser assembly as claimed in claim 1, a diode laser assembly as claimed in claim 16.

Advantages of the Invention

The laser beam source according to the invention can be produced in a simple manner and has a high power and is suitable for pulsed operation.

DESCRIPTION

The diode laser according to the invention comprises a diode laser bar. The diode laser bar can also be referred to as a laser bar. A laser bar can be embodied in a known manner as an edge-emitting component and comprise one or preferably a plurality of emitters, which can be arranged offset with respect to one another in each case in an x-direction. A laser bar can preferably have a width of between 3 mm and 12 mm in the x-direction. A laser bar can comprise a plurality of emitters arranged offset with respect to one another in a direction x and each having a light exit facet. The emitters can emit laser radiation in a principle ray direction z. A laser bar can preferably comprise between 3 and 100 emitters; in particular, laser bars having 5, 7, 19 or 49 emitters are commercially available. The center-to-center distance between adjacent emitters can preferably be between 0.1 mm and 1 mm. The thickness of the laser bar can preferably be between 0.05 mm and 0.2 mm in a y-direction. The resonator length of the emitters of a laser bar in a z-direction can preferably be between 0.5 mm and 6 mm. The direction of the central rays of the emitted laser radiation can be the z-direction. The directions x, y and z can be at right angles to one another. The laser bar can comprise a known epitaxially produced layer sequence as a p-n junction having a quantum trench. The individual emitters can be embodied as broad strip emitters or as ridge waveguides, for example. A plurality of layer sequences each having at least one quantum trench, i.e. a plurality of p-n junctions situated electrically in series, can also be present. Such bars are also referred to as a nanostack. A plurality of emitters are then stacked one above another in the y-direction.

A laser bar can be pumped by an electric current. For the purpose of injecting current, an N-type contact and a P-type contact can be provided at the laser bar, which contacts can be embodied as parallel surfaces on the top side and underside, respectively, of the laser bar and can be arranged in xz-planes.

The laser bar can be arranged in an xz-plane in relation to the coordinate system mentioned above.

The laser assembly according to the invention comprises at least one diode laser bar, at least one heat sink having a first connection surface, and at least one cover having a second connection surface, wherein the diode laser bar comprises one or a plurality of emitters, at least one P-type contact and at least one N-type contact, and the P-type contact comprises a first metal layer and the N-type contact comprises a second metal layer, and the heat sink is electrically and thermally connected to the P-type contact at the first connection surface and the N-type contact is electrically connected to the cover at the second connection surface, and the first and/or the second connection surface are/is covered with nanowires or nanotubes.

The heat sink can be produced from a metal, for example from copper, silver, aluminum, molybdenum-copper or tungsten-copper, or from a composite material such as diamond-copper or diamond-silver.

The cover can be produced from a metal, for example from copper, silver, aluminum, molybdenum-copper or tungsten-copper, or from a composite material such as diamond-copper or diamond-silver.

The P-type contact can be the anode connection of the laser bar, and the N-type contact can be the cathode connection of the laser bar.

In one advantageous embodiment, the cover can be joined together with the heat sink by way of an electrically insulating layer.

The heat sink can be provided for dissipating the waste heat of the diode laser bar. The cover can likewise have the function of a (second) heat sink and be provided for dissipating waste heat from the laser bar. In that case, the N-type contact at the second connection surface can additionally also be thermally connected to the cover.

The heat sink can also comprise cooling channels for a coolant.

"Electrically connected" can be understood to mean that the operating current of the laser can be passed via this connection. "Thermally connected" can be understood to mean that waste heat can be dissipated from the laser bar via this connection.

The electrically insulating layer can be for example an adhesive layer, advantageously a thermally conductive adhesive, by which the cover is secured to the heat sink.

The first metal layer can have a thickness of 1 µm to 10 µm. By way of example, the first metal layer can be embodied as a thick gold layer or comprise such a layer. The first metal layer can comprise an electrolytically produced layer, for example. The first metal layer can serve for heat spreading.

The second metal layer can have a thickness of less than 500 nm. Such a layer can be produced by sputtering, for example. A thin gold layer can be involved.

Nanowires are also referred to as nanorods. The term nanowires is intended to include whiskers as well. The nanowires can consist of a metal or a semimetal. The nanotubes can consist of carbon. They are also referred to as CNT (carbon nanotubes). Single-walled tubes can advantageously be involved.

Nanowires can be produced by means of an electrolytic process. Structures can be produced by using a nanoporous filter film, which can initially be applied to the surface to be covered.

Afterward, the nanowires can be deposited by means of the electrolytic process, and then the nanoporous film and all unrequired structures can be removed from the surface by stripping.

The nanowires can be produced from metals that can be deposited electrolytically, e.g. copper, silver, gold. The nanowires can have diameters of between 30 nm and 2 µm and lengths of up to approximately 20 µm.

The occupation density of the nanowires or nanotubes on the surface can be between 5% and approximately 80%. Occupation density can be understood to mean the ratio of the sum of the cross-sectional areas of the nanowires to the wired base area. In the case of nanotubes, the calculation of the cross-sectional area can be based on the external diameter of the tubes, while the hollow interior can be disregarded. An excessively low or excessively high occupation density can be detrimental to the advantageous effect.

A suitable production method for nanowires is described in http://www.nanowired.de/technologie/.

The production of carbon nanotubes is likewise known. For electrodes, in particular, carbon nanotubes formed perpendicular to a base area are known, for example from Ryu, J. -H.; Lee, G. -J.; Kim, W. -S.; Lim, H. -E.; Mativenga, M.; Park, K. -C.; Park, H. -K. All-Carbon Electrode Consisting of Carbon Nanotubes on Graphite Foil for Flexible Electrochemical Applications. *Materials* 2014, 7, 1975-1983 and U.S. Pat. No. 7,710,709.

The nanowires and/or the nanotubes can be oriented in a preferred direction perpendicular to the first and/or second connection surface, respectively. They can advantageously be fixedly connected to the respective surface.

Particularly advantageously, the first connection surface can be covered with nanotubes and/or nanowires and the first metal layer can have a thickness of 1 µm to 10 µm and the nanotubes and/or nanowires can have a greater hardness than the first metal layer. In that case, the nanotubes and/or the nanowires can be at least partly stuck into the first metal layer. A connection of the laser bar to the heat sink which exhibits few mechanical stresses and good electrical and thermal conductivity can be produced as a result.

Advantageously, the second connection surface can be covered with nanotubes and/or nanowires and the nanotubes and/or nanowires can have a greater hardness than the second metal layer and be at least partly stuck into the latter.

Advantageously, the second connection surface can be covered with nanotubes and/or nanowires and the nanotubes and/or nanowires can be elastically or plastically deformed. In this case, the nanotubes and/or nanowires can be compressed, bent or curved. That can have the advantage that the pressure force of the laser bar onto the heat sink can be maintained, for example with regard to the aging of the component, in the event of load change during pulsed operation and in the event of cyclic thermal loading.

The first connection surface can comprise an indium layer or a gold layer. The following combination can be advantageous: the first connection surface can comprise an indium layer, the P-type contact of the laser bar can comprise a first metal layer comprising a thick gold layer having a thickness of between 1 µm and 10 µm, and the second connection surface of the cover can be covered with nanowires or nanotubes. A diffusion barrier layer, for example a palladium, nickel or platinum layer, can be provided between the thick gold layer and the indium layer. Said diffusion barrier layer can be embodied as part of the first metal layer. As an alternative to the indium layer mentioned, the first connection surface can comprise a tin layer or an indium-tin layer. In the case of an indium-tin layer, the latter can have a eutectic composition.

The following combination can be particularly advantageous: the first connection surface can comprise a gold layer, the P-type contact of the laser bar can comprise a first metal layer comprising a thick gold layer having a thickness of between 1 µm and 10 µm, and the second connection surface of the cover can be covered with nanowires or nanotubes. The gold layer of the first connection surface can be brought directly into contact with the thick gold layer on the P-type contact of the laser bar. Cold welding of the two gold layers mentioned can, but need not, occur in this case.

In a further advantageous embodiment, the second connection surface can be covered with nanotubes and/or nanowires and the second metal layer can have a thickness of less than 500 nm. In that case, the nanotubes and/or nanowires cannot stick significantly into the second metal layer. The deformation of the nanotubes and/or nanowires can be more effective as a result. Advantageously, the deformation can be so great that the covering with nanotubes and/or nanowires is compressed by a factor of at least 2. The volume of the covering before and after deformation can be used as a measure in this case.

Advantageously, the nanotubes and/or nanowires can have an external diameter of less than 5 µm, particularly advantageously of less than 2 µm, and very particularly advantageously of less than 1 µm, and can have a length of more than 2 µm, particularly advantageously of more than 10 µm. The length of the nanotubes and/or nanowires can exceed double, advantageously five times, and particularly advantageously ten times, their external diameter. Unevennesses of the laser bar and/or of the heat sink and/or of the cover in the µm range can thus be compensated for.

Advantageously, the first metal layer can be covered with nanotubes and/or nanowires on the outer side. In that case, the nanotubes and/or nanowires can be produced directly on the wafer before the laser bars are singulated.

The nanowires can consist of gold. A particularly good electrical connection of the laser bar to the heat sink and/or the cover can then be produced.

The nanowires can consist of silver, nickel, chromium, platinum, tin, silicon, germanium or copper. Such nanowires can be suitable for sticking into a thick gold layer.

Advantageously, the first connection surface can be covered with first nanotubes or nanowires and the first metal layer is covered with third nanotubes or nanowires. In that case, the first and third nanowires or nanotubes, respectively, can engage in one another and produce a particularly good electrical and thermal connection.

Advantageously, the third nanotubes or nanowires, respectively, can consist of a different material than the first nanotubes or nanowires. Diffusion can then take place at the interfaces of the materials, which can result in an even better connection.

One advantageous laser assembly can comprise a carrier, at least one diode laser bar, at least one heat sink having a first connection surface, and at least one cover having a second connection surface, wherein the diode laser bar comprises one or a plurality of emitters, at least one P-type contact and at least one N-type contact, and the P-type contact comprises a first metal layer and the N-type contact comprises a second metal layer, and the heat sink is electrically and thermally connected to the P-type contact at the first connection surface and the N-type contact is electrically connected to the cover at the second connection surface, and the first and/or the second connection surface are/is covered with nanowires or nanotubes, and the heat sink comprises a third connection surface, which is covered with fourth nanowires, and the carrier is covered with fifth nanowires and the fourth nanowires engage into the fifth nanowires and the heat sink is connected to the carrier by means of this engagement.

If a plurality of diode laser bars are present, each diode laser bar can comprise in each case a P-type contact and an N-type contact and each P-type contact can comprise a first metal layer and each N-type contact a second metal layer. The first metal layers can be constructed in an identical way, as can the second metal layers. A plurality of diode laser bars can be of identical type.

The fourth and fifth nanowires can form a hook and loop fastener, which ensures a permanent connection of the heat sink to the carrier. For this purpose, by way of example, the method referred to as KlettWelding [hook and loop welding] which is described in http://www.nanowired.de/ is able to serve. In addition, a cold welding effect can be present, as described for example in Lu, Yang; Huang, Jian Yu; Wang, Chao; Sun, Shouheng; Lou, Jun (2010). "*Cold welding of ultrathin gold nanowires*". Nature Nanotechnology. 5 (3): 218-24.

Advantageously, the cover can comprise a fourth connection surface, which is covered with sixth nanowires, and the carrier is covered with seventh nanowires, wherein the seventh nanowires on the carrier are electrically insulated from the fifth nanowires, and the sixth nanowires engage into the seventh nanowires and the cover is connected to the carrier by means of this engagement.

The carrier can comprise a ceramic embodied in a plate-shaped fashion, for example. A first metallic layer region and a second metallic layer region can be present on said ceramic, which layer regions are electrically insulated from one another. The fifth nanowires can be applied on the first layer region, and the seventh nanowires on the second layer region. The electrical insulation can be provided as a result.

The cover can simultaneously be provided for heat conduction. The cover can simultaneously be provided as a second heat sink for a second laser bar. The cover of the second laser bar can simultaneously be a heat sink for a third laser bar, etc. In this way, a plurality of laser bars can be stacked parallel one above another in the y-direction with respectively intervening elements which are simultaneously covers and heat sinks.

Advantageously, the third and fourth connection surfaces can be provided perpendicular to the first connection surface. They can lie in an xy-plane. They can be situated at the heat sinks and covers, respectively.

The fourth and fifth and, if provided, the sixth and seventh nanowires can advantageously consist of gold. The cold welding effect can be particularly pronounced in that case.

A method for producing a laser assembly comprises:

providing at least one diode laser bar, at least one heat sink having a first connection surface, and at least one cover having a second connection surface, wherein the diode laser bar comprises one or a plurality of emitters, at least one P-type contact and at least one N-type contact and the P-type contact comprises a first metal layer and the N-type contact comprises a second metal layer, covering the first and/or the second connection surface with nanowires or nanotubes, producing an electrical and thermal connection of the P-type contact to the heat sink at the first connection surface, producing an electrical connection of the N-type contact to the cover at the second connection surface Production can include curing a joining medium, which thereafter forms an electrically insulating layer connecting the cover to the heat sink. A clamping force can be generated as a result, which clamping force keeps the laser bar clamped between the first and second connection surfaces. Advantageously, by means of said clamping force, the nanowires and/or nanotubes can also stick into the first and/or second metal layer and/or be deformed.

Advantageously, post-curing can be provided. The post-curing can be heat treatment which involves subjecting the laser assembly to an elevated temperature relative to room temperature once or repeatedly over a specific period of time. The connection of the P-type contact and/or of the N-type contact to the nanowires or the nanotubes can be improved as a result. The electrical and/or thermal conductivity of said connection can be improved as a result.

A further method for producing a laser assembly comprises:
providing a carrier,
providing at least one diode laser bar, at least one heat sink having a first connection surface, and a third connection surface and at least one cover having a second connection surface, wherein the diode laser bar comprises one or a plurality of emitters, at least one P-type contact and at least one N-type contact and the P-type contact comprises a first metal layer and the N-type contact comprises a second metal layer,
covering the first and/or the second connection surface with nanowires or nanotubes,
covering the third connection surface with fourth nanowires or nanotubes,
covering the carrier with fifth nanowires or nanotubes,
producing an electrical and thermal connection of the P-type contact to the heat sink at the first connection surface and an electrical connection of the N-type contact to the cover at the second connection surface by means of a y-force,
producing an electrical and thermal connection of the P-type contact to the heat sink at the first connection surface and an electrical connection of the N-type contact to the cover at the second connection surface by means of the y-force,
connecting the heat sink to the carrier by pressing the fourth nanowires onto the fifth nanowires by means of a z-force.

The laser bar(s) and the heat sink or heat sinks and cover(s) can form a stack, which can have a stacking direction y. The y-force can be a clamping force that holds the stack together. The y-force can be an external force that holds the stack together substantially in a force-locking manner. It can act in the y-direction. Alternatively, by means of deformation of the nanotubes and/or nanowires and/or penetration into the first and second metal layers, it is possible to achieve a positively locking or cohesive engagement which enables the stack to be held together even after the clamping force has been turned off.

The z-force can be an external force that presses the stack onto the carrier. It can act in the −z direction. It can act on the heat sinks and/or the covers in such a way that they are pressed against the carrier with a uniform pressure. The mechanical loading of the laser bars can be minimized as a result. By means of the z-force, the fourth nanowires can be pressed together with the fifth nanowires, such that they produce a permanent connection which is maintained even when the z-force is turned off after pressing. This connection can function in a manner similar to a hook and loop fastener, wherein the nanowires can be plastically deformed during pressing. At the same time, the sixth nanowires can be pressed together with the seventh nanowires in the same way. These connections of the heat sink and of the cover to the carrier make it possible to maintain the clamping force in the stack, with the result that the y-force can also be turned off after pressing.

The composite in the stack can be somewhat compliant owing to the first nanowires and/or nanotubes. An excessively high shear stress on the laser bars during pressing and/or thereafter during operation of the laser can be avoided as a result.

The figures show the following:
FIG. 1 shows a first exemplary embodiment in front view.
FIG. 2 shows the first exemplary embodiment in side view.
FIG. 3 shows a second exemplary embodiment.
FIG. 4 shows the second exemplary embodiment in side view.
FIG. 5 shows a third exemplary embodiment.
FIG. 6 shows the third exemplary embodiment in side view.
FIG. 7 shows a fourth exemplary embodiment.
FIG. 8 shows the fourth exemplary embodiment in side view.
FIG. 9 shows a fifth exemplary embodiment in side view.
FIG. 10 shows a sixth exemplary embodiment.
FIG. 11 shows the production of the sixth exemplary embodiment.
FIG. 12 shows a seventh exemplary embodiment.

EXEMPLARY EMBODIMENTS

The invention is explained below on the basis of exemplary embodiments.

FIG. 1 shows a first exemplary embodiment in front view. The laser assembly 1 of the first exemplary embodiment comprises a diode laser bar 2, a heat sink 4 having a first connection surface 6, and a cover 7 having a second connection surface 8, wherein the diode laser bar comprises a plurality of emitters 9, a P-type contact 11 and an N-type contact 12 and the P-type contact comprises a first metal layer 13, which is thicker than the second metal layer 14, and the N-type contact comprises a second metal layer 14,
and the heat sink 4 is electrically and thermally connected to the P-type contact 11 at the first connection surface 6 and the N-type contact 12 is electrically connected to the cover 7 at the second connection surface 8,
and the second connection surface 8 is covered with nanowires or nanotubes 16.

The cover 7 is joined together with the heat sink 4 by way of an electrically insulating layer 15. In this case, the waste heat of the laser bar 2 can be dissipated via the first and second connection surfaces 6, 8. From the cover 7, waste heat can be conducted to the heat sink 4 via the electrically insulating layer 15. The N-type contact 12 is additionally also thermally connected to the cover 7 at the second connection surface 8.

The electrically insulating layer 15 is an adhesive layer, advantageously a thermally conductive adhesive, by which the cover is secured to the heat sink.

The first metal layer 13 has a thickness of 1 μm to 10 μm. By way of example, the first metal layer can be embodied as or comprise a thick gold layer. The first metal layer can comprise a layer produced electrolytically, for example. The first metal layer can serve for heat spreading. In a modification of the exemplary embodiment, the first metal layer can be made thinner.

The second metal layer has a thickness of less than 500 nm. Such a layer can be produced by sputtering, for example. A thin gold layer is involved.

FIG. 2 shows the first exemplary embodiment in side view.
FIG. 3 shows a second exemplary embodiment.
FIG. 5 shows a third exemplary embodiment. Here, in contrast to the second exemplary embodiment, second nanowires and/or nanotubes 17 are additionally provided on the second connection surface. FIG. 6 shows the third exemplary embodiment in side view.

Figure 1:
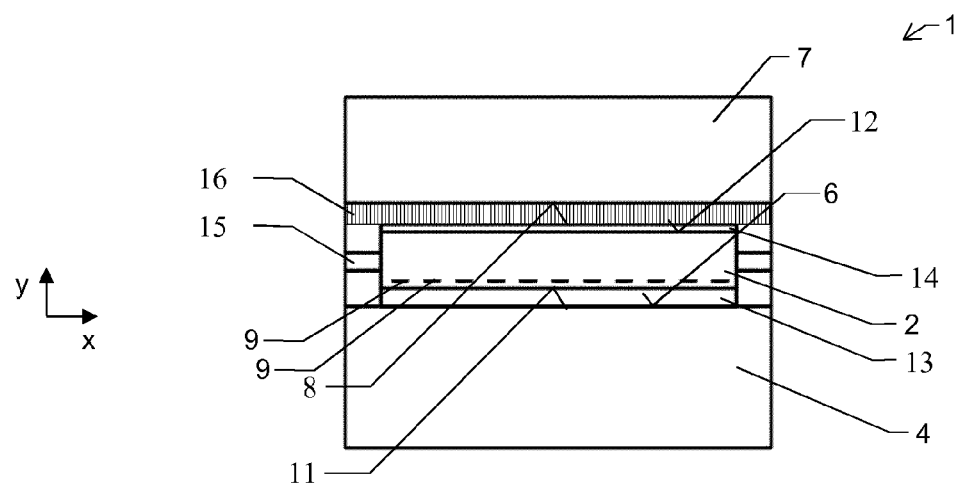
Figure 2:
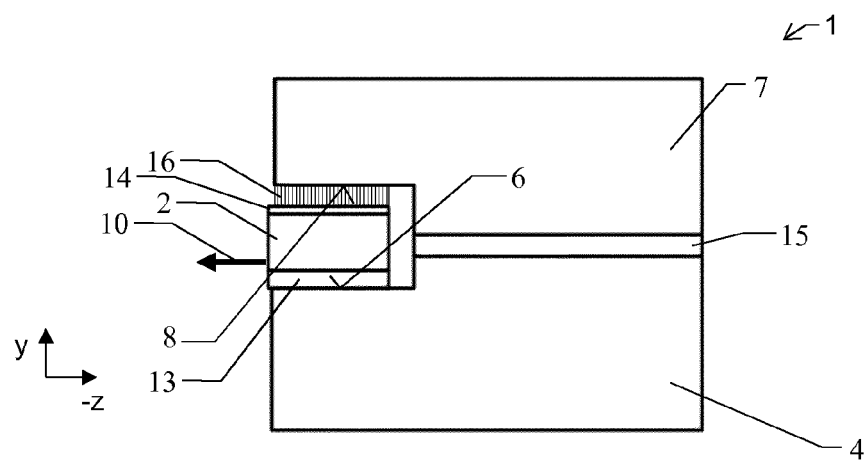
Figure 3:
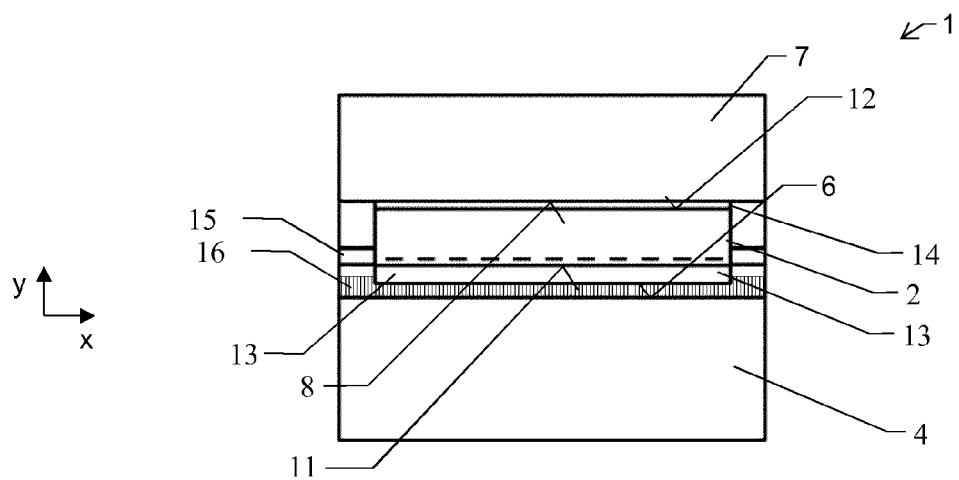
Figure 4:
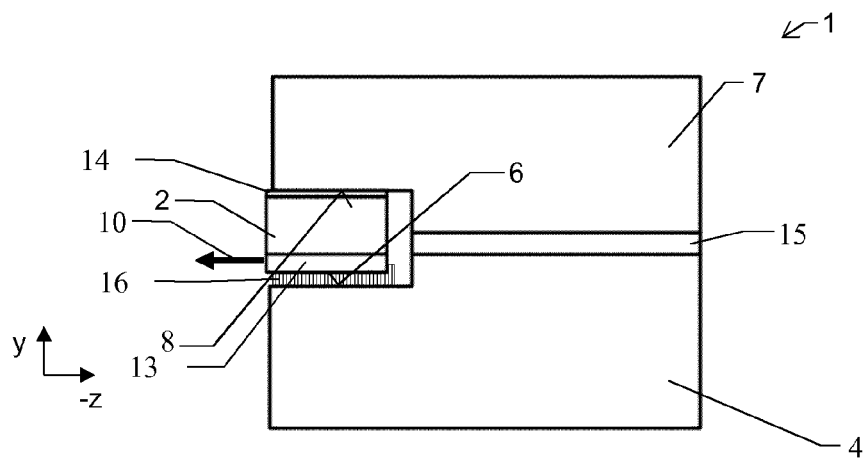
Figure 5:
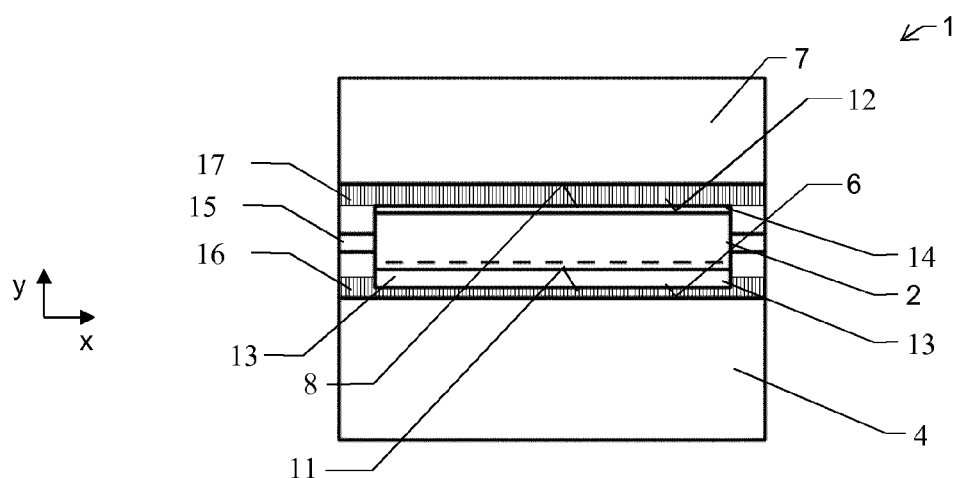
Figure 6:
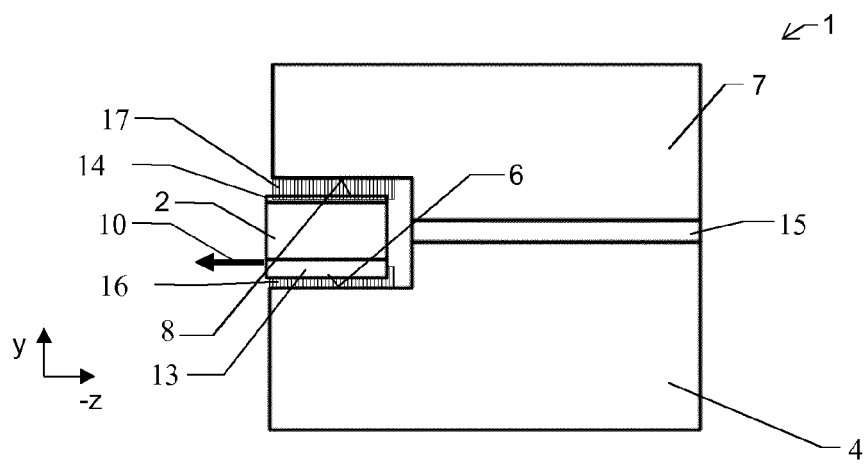
Figure 7:
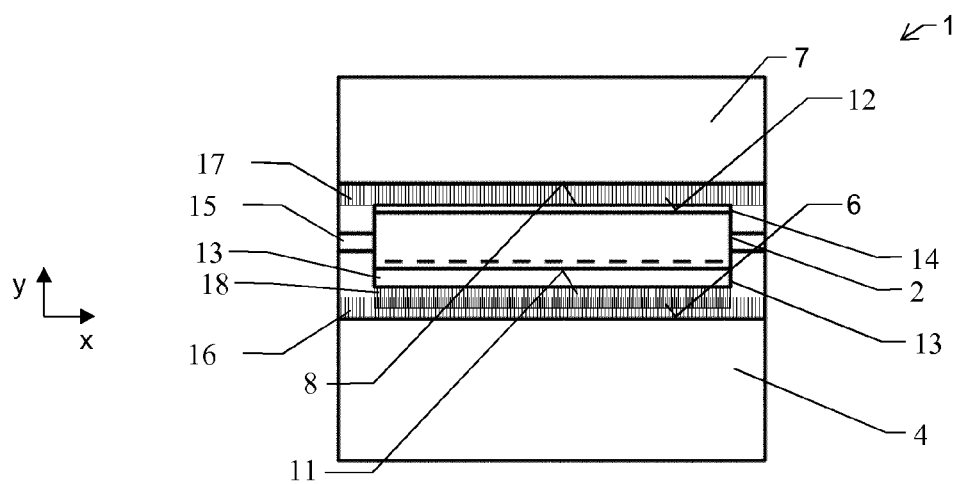
FIG. 7 shows a fourth exemplary embodiment.
Figure 8:
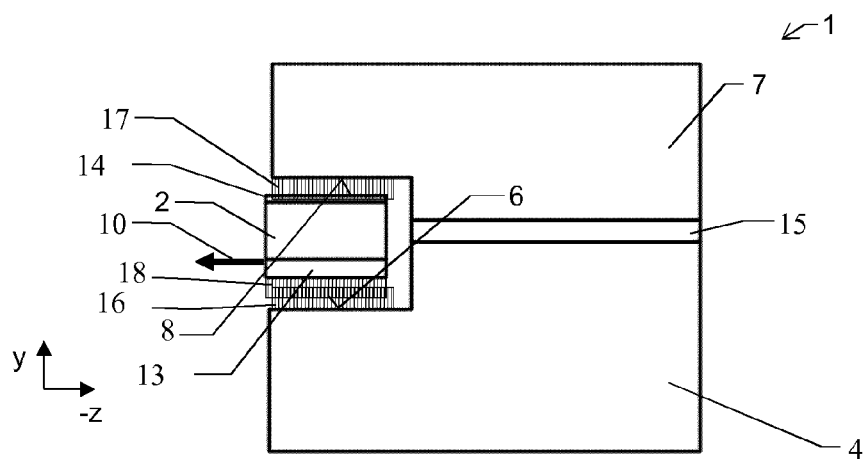
Figure 9:
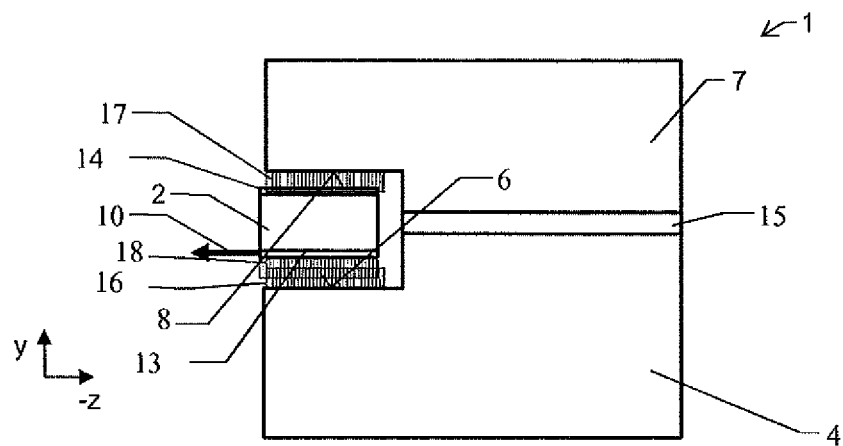
FIG. 9 shows a fifth exemplary embodiment in side view. 500 nm.

One exemplary embodiment—not illustrated pictorially—of the method for producing a laser assembly 1 comprises:

providing at least one diode laser bar 2, at least one heat sink 4 having a first connection surface 6, and at least one cover 7 having a second connection surface 8, wherein the diode laser bar comprises one or a plurality of emitters 9, at least one P-type contact 11 and at least one N-type contact 12 and the P-type contact comprises a first metal layer 13 and the N-type contact comprises a second metal layer 14, covering the first and/or the second connection surface with nanowires or nanotubes 16, producing an electrical and thermal connection of the P-type contact to the heat sink at the first connection surface, producing an electrical connection of the N-type contact to the cover at the second connection surface.

Production can include curing a joining medium, which thereafter forms an electrically insulating layer 15 connecting the cover to the heat sink. A clamping force can be generated as a result, which clamping force keeps the laser bar clamped between the first and second connection surfaces. Advantageously, by means of this clamping force, the nanowires and/or nanotubes can also stick into the first and/or second metal layer. Although the method is not illustrated pictorially, the reference signs can be gathered from the figures, FIG. 1 to FIG. 9, which show exemplary embodiments of the laser assembly.

Figure 10:
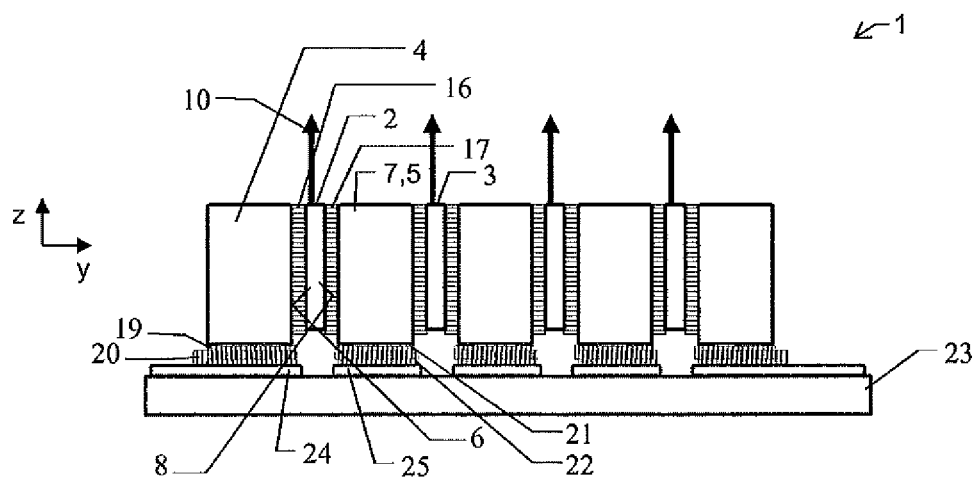

FIG. 10 shows a sixth exemplary embodiment. 4, 5 having a first connection surface 6, and at least one cover 7 having a second connection surface 8. The diode laser bars comprise one or a plurality of emitters 9 (not illustrated here, analogous to the illustration in FIG. 1), at least one P-type contact 11 and at least one N-type contact 12. The P-type contact comprises a first metal layer 13 and the N-type contact comprises a second metal layer 14. The heat sink is electrically and thermally connected to the P-type contact at the first connection surface and the N-type contact is electrically connected to the cover at the second connection surface. The first and/or the second connection surface are/is covered with nanowires or nanotubes 16. The heat sink comprises a third connection surface covered with fourth nanowires 19. The carrier is covered with fifth nanowires 20. The fourth nanowires engage into the fifth nanowires and the heat sink is connected to the carrier as a result of this engagement.

The cover 7 of the first laser bar here is simultaneously the second heat sink 5 of the second laser bar 3.

The fourth and fifth nanowires form a hook and loop fastener that ensures a permanent connection of the heat sink to the carrier.

Advantageously, the cover can comprise a fourth connection surface, which is covered with sixth nanowires 21, and the carrier is covered with seventh nanowires 22, wherein the seventh nanowires on the carrier are electrically insulated from the fifth nanowires, and the sixth nanowires engage into the seventh nanowires and the cover is connected to the carrier by means of this engagement.

The carrier 23 comprises a ceramic embodied in a plate-shaped fashion, for example. A first metallic layer region 24 and a second metallic layer region 25 are present on said ceramic, which layer regions are electrically insulated from one another. The fifth nanowires are applied on the first layer region and the seventh nanowires are applied on the second layer region. The electrical insulation is produced as a result.

The cover is simultaneously provided for heat conduction. The cover 7 is simultaneously provided as a second heat sink 5 for a second laser bar 3. The same applies to further laser bars. In this way, a plurality of laser bars are stacked parallel one above another in the y-direction with respectively intervening heat sinks.

The third and fourth connection surfaces are provided perpendicular to the first connection surface. They lie in an xy-plane.

The fourth and fifth and, if provided, the sixth and seventh nanowires can advantageously consist of gold. The cold welding effect can be particularly pronounced in that case. In modifications of the exemplary embodiment, said nanowires are produced from other metals.

Figure 11:
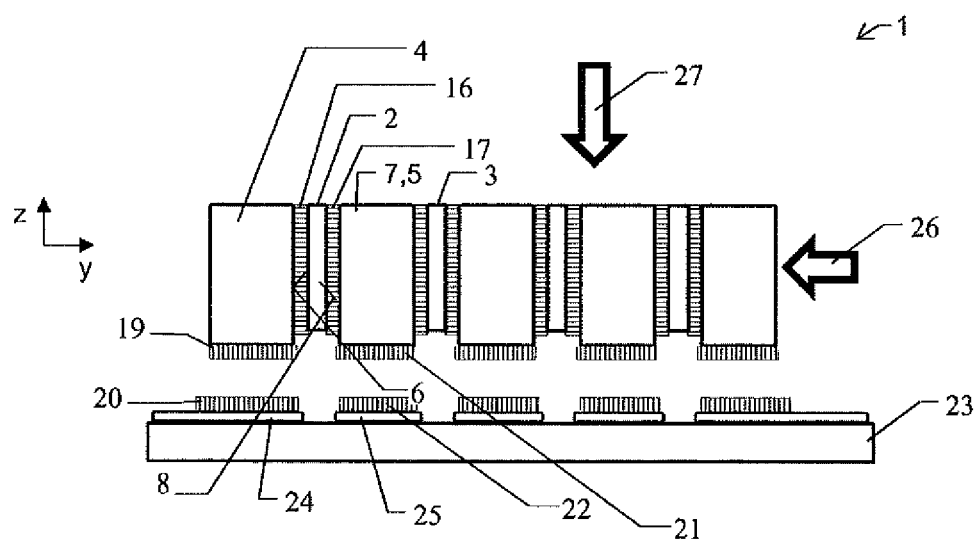

A further method according to FIG. 11 for producing a laser assembly 1 of the sixth exemplary embodiment and analogously of the seventh exemplary embodiment comprises providing a carrier 23, providing at least one diode laser bar 2, at least one heat sink 4 having a first connection surface 6, and a third connection surface and at least one cover 7 having a second connection surface 8, wherein the diode laser bar comprises one or a plurality of emitters 9, at least one P-type contact 11 and at least one N-type contact 12 and the P-type contact comprises a first metal layer 13 and the N-type contact comprises a second metal layer 14, covering the first and/or the second connection surface with nanowires or nanotubes 16, 17, covering the third connection surface with fourth nanowires or nanotubes 19, covering the carrier with fifth nanowires or nanotubes 20, producing an electrical and thermal connection of the P-type contact to the heat sink at the first connection surface and an electrical connection of the N-type contact to the cover at the second connection surface by means of a y-force 26, producing an electrical and thermal connection of the P-type contact to the heat sink at the first connection surface and an electrical connection of the N-type contact to the cover at the second connection surface by means of the y-force 26, connecting the heat sink to the carrier by pressing the fourth nanowires onto the fifth nanowires by means of a z-force 27.

The laser bar(s) and the heat sink or heat sinks and cover(s) form a stack, which has a stacking direction y. The y-force is a clamping force that holds the stack together. The y-force is an external force that holds the stack together substantially in a force-locking manner. It acts in the y-direction. In a modification of the exemplary embodiment, by means of deformation of the nanotubes and/or nanowires and/or penetration into the metal layers, a positively locking or cohesive engagement is achieved which enables the stack to be held together even after the clamping force has been turned off.

The z-force is an external force that presses the stack onto the carrier. It acts in the −z direction. It can act on the heat sinks and/or the covers in such a way that they are pressed against the carrier with a uniform pressure. The mechanical loading of the laser bars is minimized as a result. By means of the z-force, the fourth nanowires are pressed together with the fifth nanowires, such that they produce a permanent connection which is maintained even when the z-force is turned off after pressing. This connection can function in a manner similar to a hook and loop fastener, wherein the nanowires can be plastically deformed during pressing. At the same time, the sixth nanowires can be pressed together with the seventh nanowires in the same way. These connections of the heat sink and of the cover to the carrier maintain the clamping force in the stack, with the result that the y-force can also be turned off after pressing.

The composite in the stack is somewhat compliant owing to the first nanowires and/or nanotubes. An excessively high shear stress on the laser bars during pressing and/or thereafter during operation of the laser can be avoided as a result.

Figure 12:
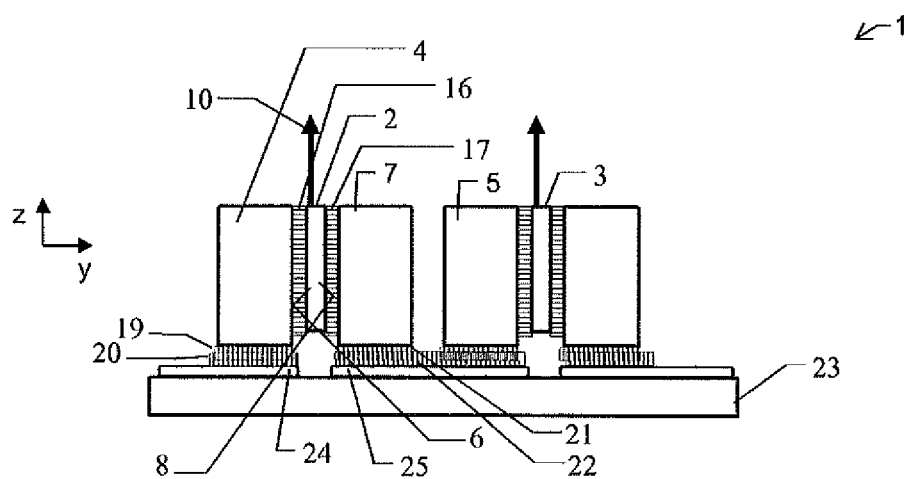

FIG. 12 shows a seventh exemplary embodiment.

As a precaution it should be pointed out that the figures are not depicted to scale.

REFERENCE SIGNS

1. Laser assembly
2. Diode laser bar; first diode laser bar
3. Second diode laser bar
4. Heat sink; first heat sink
5. Second heat sink
6. First connection surface
7. Cover
8. Second connection surface
9. Emitter
10. Laser radiation
11. P-type contact
12. N-type contact
13. First metal layer
14. Second metal layer
15. Electrically insulating layer
16. Nanowires; nanotubes
17. Second nanowires; second nanotubes
18. Third nanowires; third nanotubes
19. Fourth nanowires
20. Fifth nanowires
21. Sixth nanowires
22. Seventh nanowires
23. Carrier
24. First layer region
25. Second layer region
26. y-force
27. z-force

The invention claimed is:

1. A laser assembly, comprising at least one diode laser bar, at least one heat sink having a first connection surface, and at least one cover having a second connection surface, wherein the diode laser bar comprises one or a plurality of emitters, at least one P-type contact and at least one N-type contact, and the P-type contact comprises a first metal layer and the N-type contact comprises a second metal layer, and the heat sink is electrically and thermally connected to the P-type contact at the first connection surface and the N-type contact is electrically connected to the cover at the second connection surface, and the first and/or the second connection surface are/is covered with nanowires,
wherein the nanowires consist of a metal; and
wherein the first connection surface is covered with the nanowires and the first metal layer has a thickness of 1 µm to 10 µm and the nanowires have a greater hardness than the first metal layer and are at least partly stuck into the latter.

2. The laser assembly as claimed in claim 1, wherein the cover is joined together with the heat sink by way of an electrically insulating layer.

3. The laser assembly as claimed in claim 1, wherein the first metal layer has a thickness of 1 µm to 10 µm.

4. The laser assembly as claimed in claim 1, wherein the second metal layer has a thickness of less than 500 nm.

5. The laser assembly as claimed in claim 1, wherein the nanowires are oriented in a preferred direction perpendicular to the first and/or second connection surface, respectively.

6. The laser assembly as claimed in claim 1, wherein the nanowires have an external diameter of less than 1 µm and have a length of more than 2 µm.

7. The laser assembly as claimed in claim 1, wherein the first metal layer is covered with the nanowires on an outward side.

8. The laser assembly as claimed in claim 1, wherein the metal consists of gold, silver, nickel, chromium or copper.

9. The laser assembly as claimed in claim 1, wherein the first connection surface is covered with a first nanowire and the first metal layer is covered with a third nanowire.

10. The laser assembly as claimed in claim 9, wherein the third nanowire consists of a different material than the first nanowire.

11. The laser assembly as claimed in claim 1, wherein that a third and a fourth connection surfaces are provided perpendicular to the first connection surface.

12. A laser assembly, comprising at least one diode laser bar, at least one heat sink having a first connection surface, and at least one cover having a second connection surface, wherein the diode laser bar comprises one or a plurality of emitters, at least one P-type contact and at least one N-type contact, and the P-type contact comprises a first metal layer and the N-type contact comprises a second metal layer, and the heat sink is electrically and thermally connected to the P-type contact at the first connection surface and the N-type contact is electrically connected to the cover at the second connection surface, and the first and/or the second connection surface are/is covered with nanowires,
wherein the nanowires consist of a metal; and
wherein the second connection surface is covered with the nanowires and the nanowires have a greater hardness than the second metal layer and are at least partly stuck into the latter.

13. The laser assembly as claimed in claim 12, wherein the second connection surface is covered with the nanowires and the nanowires are elastically or plastically deformed.

14. The laser assembly as claimed in claim 12, wherein the second connection surface is covered with the nanowires and the second metal layer has a thickness of less than 500 nm.

15. A laser assembly, comprising a carrier, at least one diode laser bar, at least one heat sink having a first connection surface, and at least one cover having a second connection surface, wherein the diode laser bar comprises one or a plurality of emitters, at least one P-type contact and at least one N-type contact, and the P-type contact comprises a first metal layer and the N-type contact comprises a second metal layer, and the heat sink is electrically and thermally connected to the P-type contact at the first connection surface and the N-type contact is electrically connected to the cover at the second connection surface, and the first and/or the second connection surface are/is covered with nanowires or nanotubes, and the heat sink comprises a third connection surface, which is covered with fourth nanowires, and the carrier is covered with fifth nanowires and the fourth nanowires engage into the fifth nanowires and the heat sink is connected to the carrier by means of this engagement.

16. The laser assembly as claimed in claim 15, wherein the cover comprises a fourth connection surface, which is covered with sixth nanowires, and the carrier is covered with seventh nanowires, wherein the seventh nanowires on the carrier are electrically insulated from the fifth nanowires, and the sixth nanowires engage into the seventh nanowires and the cover is connected to the carrier by means of this engagement.

\* \* \* \* \*